United States Patent [19]
Ito

[11] Patent Number: 5,893,662
[45] Date of Patent: Apr. 13, 1999

[54] IMAGE FORMING DEVICE

[75] Inventor: Koji Ito, Nagoya, Japan

[73] Assignee: Brother Kogyo Kabushiki Kaisha, Nagoya, Japan

[21] Appl. No.: 08/962,330

[22] Filed: Oct. 31, 1997

[30]   Foreign Application Priority Data

Nov. 5, 1996   [JP]   Japan ................................. 8-310008

[51] Int. Cl.[6] ................................................ G03G 15/00
[52] U.S. Cl. ........................ 399/110; 399/107; 399/111
[58] Field of Search ............................ 399/2, 4, 90, 110, 399/111, 113, 400, 402, 403–407, 107; 347/108, 152, 222

[56]   References Cited

U.S. PATENT DOCUMENTS

| | | | |
|---|---|---|---|
| 4,708,455 | 11/1987 | Kubota et al. ........................... | 399/111 |
| 4,994,853 | 2/1991 | Fukuchi et al. ........................... | 399/12 |
| 5,105,221 | 4/1992 | Takahashi et al. ........................ | 399/111 |
| 5,262,827 | 11/1993 | Lee .......................................... | 399/111 |
| 5,542,487 | 8/1996 | Schultz et al. ........................... | 178/4.1 A |
| 5,559,932 | 9/1996 | Machida et al. ........................ | 395/114 |

*Primary Examiner*—Matthew S. Smith
*Attorney, Agent, or Firm*—Oliff & Berridge, PLC

[57]   ABSTRACT

The insertion and removal of an image forming unit, inserted into the storage bay of the enclosure of electronic equipment so that it can be removed, is made easy, and the clearance of paper jams and maintenance operations, etc., are facilitated. An outer case is fitted inside the storage bay, for accommodating hard disk drives, etc., of the electronic equipment (e.g., a computer), and an image forming unit is inserted into this outer case so that it can be removed. Slides for supporting the main case, so that it can slide backward and forward are provided at the bottom of the outer case. In the image forming process, a latent image is formed on the microcapsule sheet by dot-wise exposure with LEDs, after which pressure development takes place, whereupon a color image is formed on the microcapsule sheet.

7 Claims, 11 Drawing Sheets

IMAGE FORMING DEVICE

BACKGROUND OF THE INVENTION

The present invention is related to an image forming device, and more particularly to an image forming device that can be inserted into the predetermined storage bay of the enclosure of electronic equipment.

In the enclosure of electronic equipment, such as computers for example, one or a plurality of storage bays (storage spaces) for storing external devices such as CD-ROM drives, hard disk drives, etc., is provided, and the external devices can be accommodated therein according to need. Further, external devices such as CD-ROM drives and hard disk drives, etc., stored in the storage bays, can be used, once the signal and power cables connected to the computer are respectively connected to a pair of parallel ports provided at the rear end of the external devices via connectors, after having removed the rear panel fixed to the rear of the storage bays by machine screws or some other means.

On the other hand, various image forming devices, connected to electronic equipment via cables and connectors, for printing on a recording medium based on image data output from the electronic equipment have been put into practical use. Further, it is also possible to constitute the before-mentioned image forming device so that it can be used and inserted into the storage bay of the electronic equipment in the same way as the above-mentioned external devices such as CD-ROM drives and hard disk drives.

Then, an image forming device, made so as to fit into the before-mentioned storage bays, can be used, when inserted into the storage bay in the same way as the before-mentioned external devices such as CD-ROM drives and hard disk drives, once the signal and power cables connected to the computer are respectively connected to a pair of parallel ports provided at the rear end of the image forming device via connectors, after having removed the before-mentioned rear panel of the storage bay.

Further, in order to insert an image forming device into the storage bay, a constitution for both feeding and discharging the recording media at the front of the image forming device needs to be adopted, which means that a sheet feeder tray for accommodating a plurality of recording media has to be mounted to the front of the image forming device.

With conventional image forming devices, the cover of the image forming device is opened to perform maintenance operations or clear paper jams. For the before-mentioned image forming device, used while inserted into a storage bay, this means that frequent removal from and insertion into the storage bay is necessary for maintenance operations or clearance of paper jams.

However, the before-mentioned storage bays are not made so as to permit smooth insertion and removal of external devices, because external devices such as CD-ROM drives and hard disk drives, once inserted into the storage bay, are hardly ever removed. I.e. , image forming devices cannot be smoothly inserted into or removed from storage bays for maintenance operations or clearance of paper jams.

Further, when frequently inserting an image forming device into and removing it from a storage bay, as described above, the above-mentioned connectors and parallel ports have to be connected and disconnected each time, therefore, the insertion of the image forming device into and its removal from the storage bay becomes extremely troublesome.

Moreover, with an image forming device inserted into a storage bay, regarding the feeding of the recording media and the discharging of the printed recording media at the front of the image forming device, as described above, the sheet feeder tray being mounted to the front of the main case protrudes far beyond the front of the storage bay and is likely to get very much in the way. And since a constitution for transporting the recording media in a U-turn or forward and backward needs to be adopted, the problem arises that the structure of the sheet transport mechanism, and other systems, becomes complicated, and the manufacturing costs increase significantly.

SUMMARY OF THE INVENTION

The object of the present invention is to enable the smooth insertion of an image forming device into and its removal from a predetermined storage bay of an electronic equipment, eliminate the need for connecting and disconnecting the electrical wiring linking the image forming device to the electronic equipment, avoid the protrusion of the sheet feeder tray beyond the front of the storage bay, simplify the structure of the sheet transport mechanism, etc., and reduce the manufacturing costs, etc., of the image forming device for insertion into the storage bay.

The image forming device of the present invention is an image forming device for insertion into the predetermined storage bay of an electronic equipment comprising an image forming unit forming an image on a recording medium, an outer case disposed in said storage bay, and a main case accommodating said image forming unit and being inserted into the outer case so as to be removable. Namely, the main case, into which the image forming unit is integrated, has to be frequently inserted into and removed from the storage bay for performing maintenance operations or for clearing paper jams; however, since the outer case slid into and fitted while inside the storage bay is provided, and since the main case is inserted into this outer case so as to be removable, the main case can be inserted into and removed from the outer case very smoothly.

One embodiment of the present invention is the above-mentioned image forming device further comprising a connector electrically connecting said image forming unit to the electronic equipment are provided. Namely, by means of the connector means it is possible to establish a reliable electrical connection between the image forming device and the electronic equipment. Otherwise, this embodiment has the same advantageous effects as the embodiment mentioned above.

A further embodiment is the above-mentioned embodiment wherein the connector connects said image forming unit to the electric equipment when the main case is inserted into the outer case and disconnects said image forming unit to the electronic equipment when the main case is pulled out of the outer case. Namely, the connecting and disconnecting of the electrical wiring connecting the image forming device to the electronic equipment when inserting the main case into or removing it from the outer case can be omitted. Otherwise, this embodiment has the same advantageous effects as the embodiments mentioned above.

Another embodiment of the present invention further comprises a media stacker accommodating a plurality of recording media, wherein the image forming unit is located in the front portion of the main case and said media stacker is provided in the rear portion of the main case. Namely, since there is no need to provide a sheet feeder tray at the outside of the main case, no sheet feeder tray protrudes beyond the front of the storage bay. Moreover, the recording media does not have to be transported in a U-turn or forward and backward; and since the transport path of the recording medium is provided in a straight line and the recording medium can be transported in one direction, the structure of the sheet transport mechanism, etc., can be simplified, and the manufacturing costs can be significantly reduced. Otherwise, this embodiment has the same advantageous effects as the embodiments mentioned above.

Yet another embodiment of the present invention is that the outer case includes a slide for supports the main case slidably in backward and forward directions in said outer case. Consequently, the sliding friction between the outer case and the main case is reduced, and the main case can be inserted into and removed from the outer case even more smoothly. Otherwise, this embodiment has the same advantageous effects as the embodiments mentioned above.

Still another embodiment of the present invention is that the image forming unit is electrically connected to the electronic equipment via a cable folded at a space between the rear end of the main case and an outer case wall opposite to the rear end of the main case. Namely, the connecting and disconnecting of the electrical wiring connecting the image forming device to the electronic equipment when inserting the main case into or removing it from the outer case can be omitted. Otherwise, this embodiment has the same advantageous effects as the embodiments mentioned above.

A still further embodiment of the present invention is that the recording medium comprises a plurality of microcapsules encapsulating a coloring agent, that undergo a change of strength when irradiated with light of a predetermined wavelength, wherein said image forming unit comprises an exposure unit forming a latent image upon exposure based on image information on the recording medium by changing strength of microcapsules, and developing unit developing the latent image with the coloring agent coming out of the microcapsules by breaking the microcapsules based on the latent image.

In this image forming device, an image can be formed on the photosensitive recording medium by first forming a latent image on the photosensitive recording medium upon exposure based on image information by the exposure unit, and by then developing the latent image via the coloring agent coming out of the microcapsules when pressure is applied to the photosensitive recording medium on which the latent image was formed by the exposure unit. Otherwise, this embodiment has the same advantageous effects as any one of the embodiments mentioned above.

BRIEF DESCRIPTION OF THE DRAWINGS

Preferred embodiments of the present invention will be described in detail with reference to the following figures, wherein.

DETAILED DESCRIPTION OF THE PREFERRED EMBODIMENTS

Figure 1:
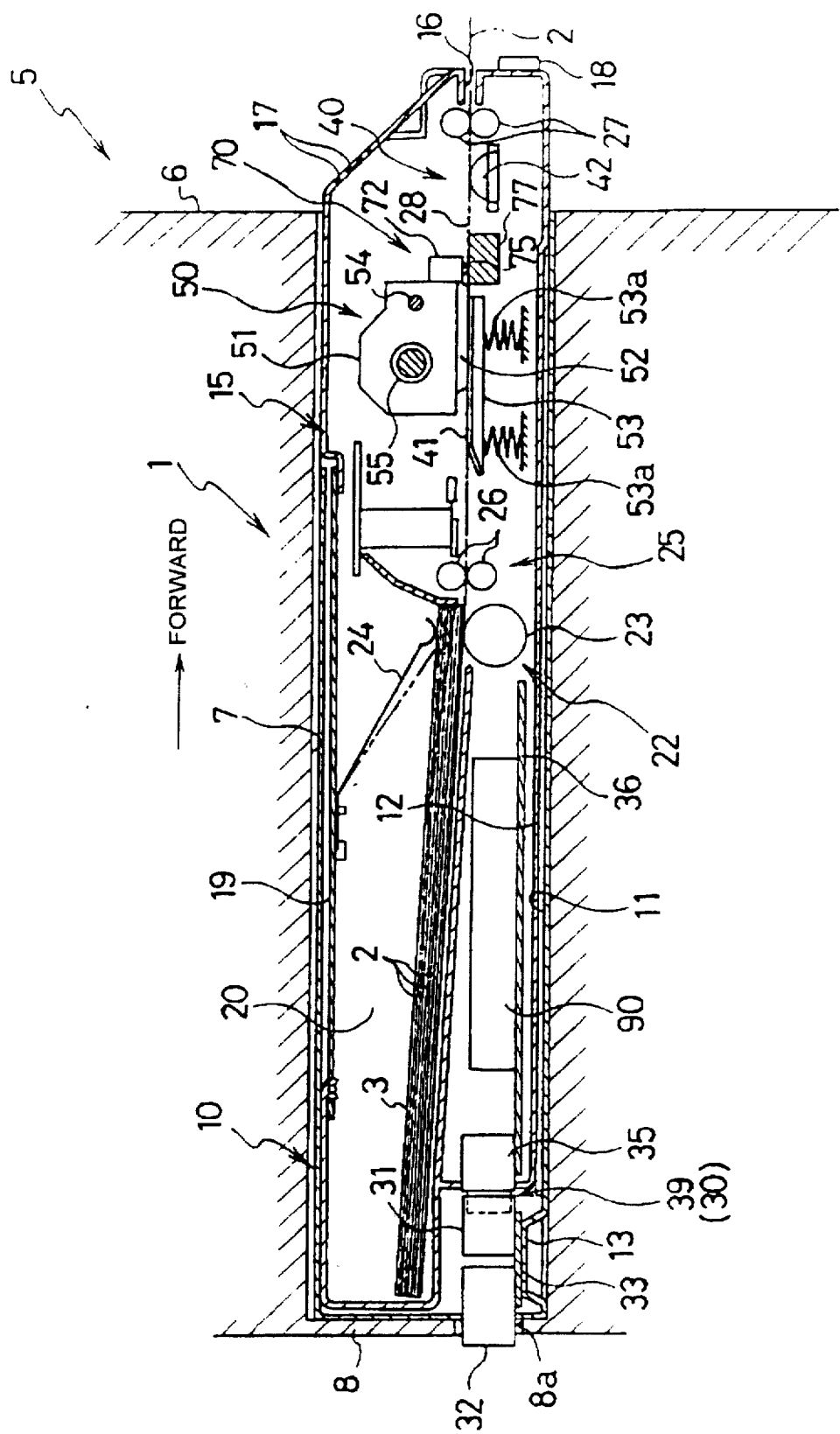
FIG. 1 is a side view in cross section showing a photo and pressure sensitive printer related to the present invention.

Preferred embodiments of the invention will be described with reference to the accompanying drawings.

The photo and pressure sensitive printer 1, related to the present embodiment, is an image forming device for forming a color image on a microcapsule sheet 2, the photosensitive recording medium, by developing the latent image formed by exposure of the microcapsule sheet 2 based on image information, which is, as shown in FIGS. 1–4, inserted into a predetermined storage bay 7 of a tower-type enclosure 6 of a computer 5, wherein a main case 15 of the photo and pressure sensitive printer 1 is inserted into an outer case 10 fitted in the before-mentioned predetermined storage bay 7 so as to be removable.

The storage bay 7 of the computer 5 is formed so that external devices such as CD-ROM drives and hard disk drives can be inserted thereinto, and the photo and pressure sensitive printer 1 is made so that it can be inserted into this storage bay 7. At the rear of the storage bay 7 a rear panel 8 is fixed by machine screws or some other means, and this rear panel 8 is typically removed to connect the external devices stored in the storage bay 7 and the computer 5 by means of electrical wiring. In the case of the present embodiment, a cable passage 8a is formed in the rear panel 8, so that, when storing the outer case 10 in the storage bay 7, a parallel port 32 fixed in the outer case 10 protrudes outside through the cable passage 8a, and a cable connected to the computer 5 can be connected by a connector to this parallel port 32.

In the following the overall constitution of the photo and pressure sensitive printer 1 (called "printer" hereafter) will be explained. As shown in FIGS. 1–4, the printer 1 comprises the outer case 10 slid into and fitted while inside the storage bay 7, and the main case 15 inserted into this outer case 10 so as to be removable, wherein a media stacker 20 for accommodating the microcapsule sheets 2 (called "MC sheets 2" hereafter), a sheet feeder mechanism 22 for feeding the MC sheet 2 of the media stacker 20, a transport mechanism 25 for transporting the fed MC sheet 2, a heating mechanism 40 for both heat-fixing and preheating the MC sheet 2, an exposure mechanism 50 for forming a latent image on the MC sheet 2 by exposure based on image information, a ball developing mechanism 70 for developing the latent image formed on the MC sheet 2, a control unit 90, etc., are provided inside the main case 15, and is electrically connected via one pair of connector mechanisms 30 and 39 for the power and signal cables to the computer 5.

The outer case 10 and the main case 15 will be explained in detail below.

As shown in FIGS. 1–4, the outer case 10, slid into and fixedly fitted while inside the storage bay 7, is an open front metal case; at its bottom 11, one pair of a left and a right slide 12 is formed as part of the bottom 11, protruding upward and extending toward the rear and the front thereof, and the main case 15 is supported by the slides 12 so that it can slide back and forth. A circuit board 33 is fixed on an elevated rear portion 13 inside the outer case 10, and the parallel port 32 protruding from the rear of the outer case 10 and an inward facing female connector 31 connected to the parallel port 32 via the circuit board 33 are mounted on the circuit board 33.

The main case 15, on the other hand, is a metal case which is a little longer than the storage bay 7 is deep, and on its front, a sheet discharge opening 16 and a plurality of cooling slots 17 are formed and a power switch 18, etc., is provided, and at its top a top cover 19 which can be opened and closed is provided. The circuit board 36 is fixed in the lower rear portion of the main case 15, a backward facing male connector 35 protruding from the rear of the main case 15 is mounted on this circuit board 36 so that it can be connected with the before-mentioned female connector 31, and this male connector 35 is connected via the circuit board 36 to the control unit 90. Furthermore, the lower rear portion of the main case 15 is recessed from the upper rear portion toward the front so as not to interfere with the female connector 31 on the side of the outer case 10 when the main case 15 is inserted into the outer case 10, and the before-mentioned male connector 35 protrudes backward from this lower rear portion. A control panel 107 is also provided at the front of the main case 15 (refer to FIG. 13).

The before-mentioned image forming unit comprising the heating mechanism 40, exposure mechanism 50, ball developing mechanism 70, etc., is located in the front section of the main case 15, and the media stacker 20 is provided in the rear section thereof.

A lightproof cartridge 3 (called "cartridge" hereafter) for accommodating the stacked MC sheets 2 is inserted into the media stacker 20 so as to be removable. Thus, it is possible to insert the cartridge 3 into the media stacker 20 and remove it therefrom, clear a paper jam when the MC sheet 2 gets stuck, and perform maintenance operations of the before-mentioned image forming unit, when the main case 15 is pulled out of the outer case 10 and the top cover 19 is opened.

Next, the connector mechanisms 30 and 39 will be explained in detail. However, since the basic structure of the connector mechanism 30 for signals and the connector mechanism 39 for electrical power, electrically connecting the printer 1 to the computer 5, are identical, only the connector mechanism 30 for signals will be explained, and the explanation of the connector mechanism 39 for electrical power will be omitted.

Figure 4:
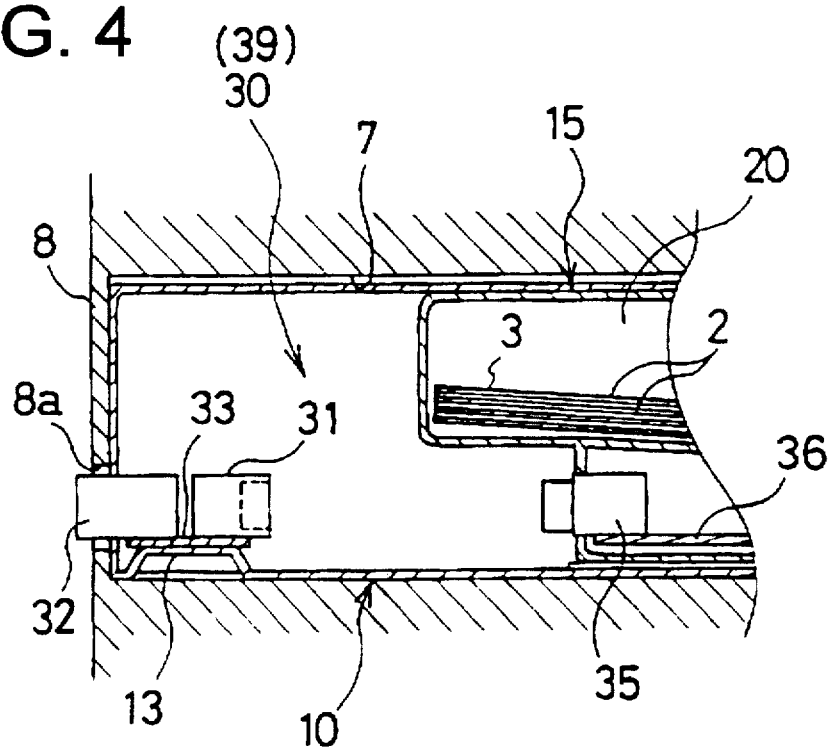
FIG. 4 is a partial side view in cross section of the above-mentioned printer showing the connector mechanism in the disconnected state.

As shown in FIGS. 1 and 4, the connector mechanism 30 comprises the female connector 31 fixed in the rear portion inside the outer case 10 and the male connector 35 fixed in the rear portion of the main case 15, wherein, as described above, the female connector 31 is connected to the parallel port 32 via the circuit board 33, a cable (not shown in the figures) extending from inside the computer is connected to the parallel port 32 via a connector (also not shown in the figures), and the male connector 35 is connected to the control unit 90 via the circuit board 36.

When the main case 15 is inserted into the outer case 10, as shown in FIG. 1, the male connector 35 is connected to the female connector 31, i.e., the printer 1 is electrically connected to the computer 5. And when the main case 15 is pulled out of the outer case 10, as shown in FIG. 4, the male connector 35 is disconnected from the female connector 31, i.e., the electrical connection between the printer 1 and the computer 5 is also disconnected. Further, when again inserting the main case 15 into the outer case 10, the male connector 35 is again connected to the female connector 31, i.e., the printer 1 is again electrically connected to the computer 5.

Further, via this connector mechanism 30 for signals, the image data (RGB data, different command signals, etc.) output from the computer 5 are supplied to the control unit 90, and different signals of the printer 1 side are supplied to the control device of the computer 5. Furthermore, electrical power is supplied from the computer 5 to the control unit 90 via the connector mechanism 39 for electrical power (refer to FIG. 2). Moreover, the drive signals for driving the exposure bed 52 are supplied to the exposure bed 52 via a flexible cable.

Figure 2:
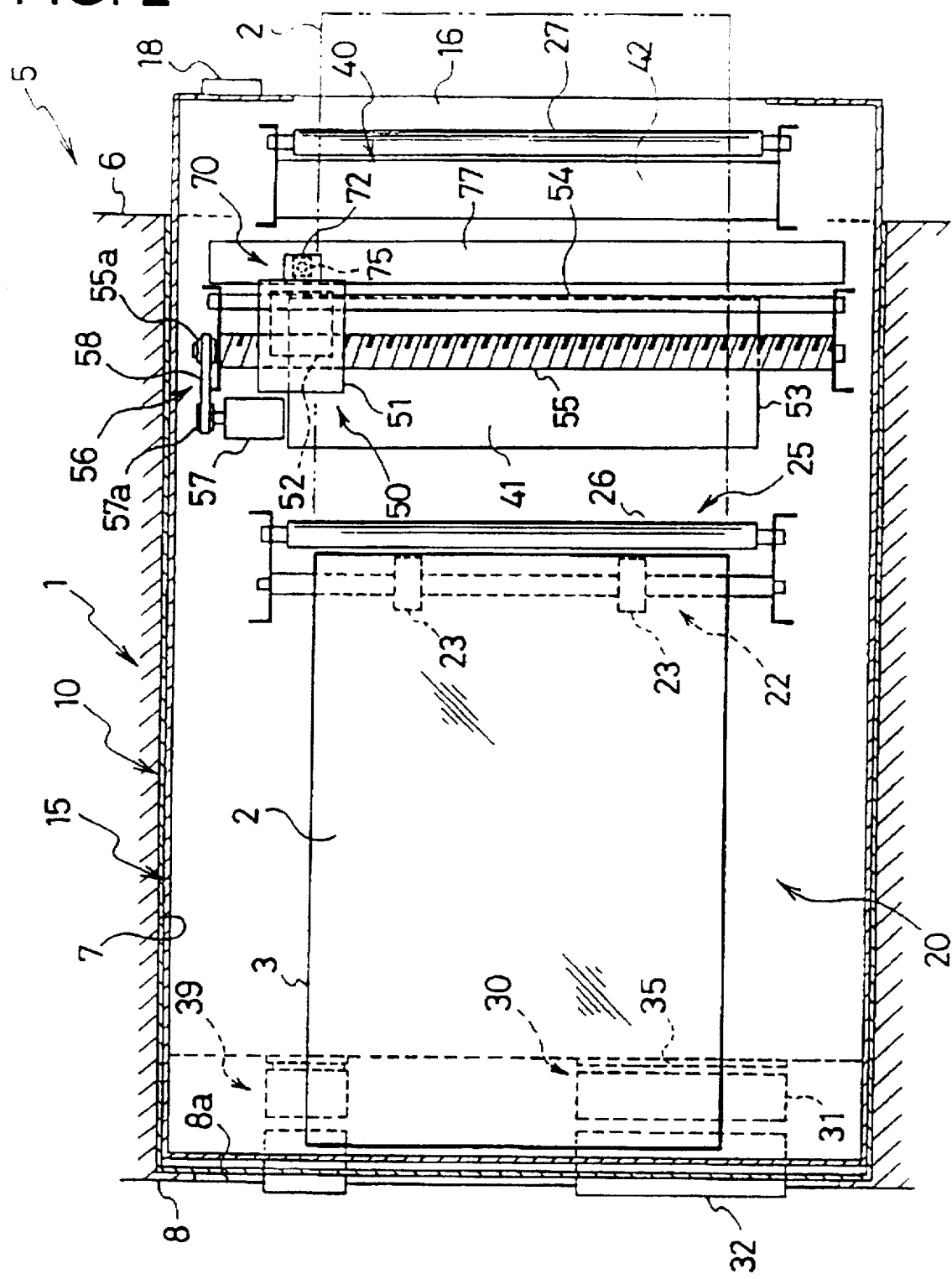
FIG. 2 is a top view in cross section of the above-mentioned printer.
Figure 3:
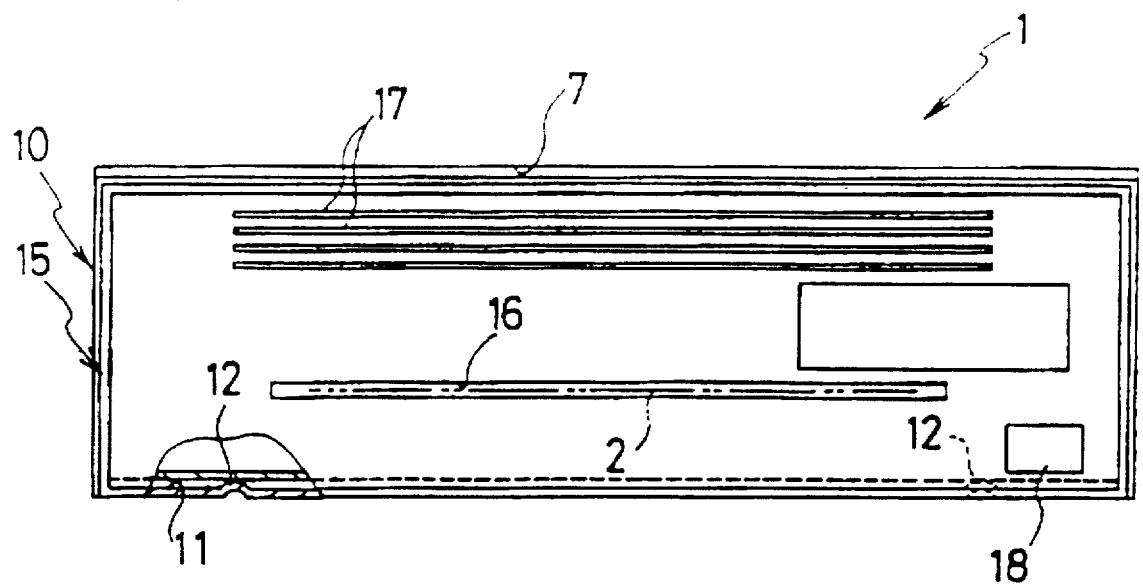
FIG. 3 is a front view of the above-mentioned printer.

Next, the sheet feeder mechanism 22 will be explained. As shown in FIGS. 1 and 2, the sheet feeder mechanism 22 comprises a sheet feeding roller 23 feeding the MC sheet 2 stacked in the cartridge 3 of the media stacker 20 one sheet at a time, a drive system (not shown in the figures) for driving the sheet feeding roller 23, a plate spring 24 for pressing the MC sheet 2 from above toward the sheet feeding roller 23, etc. Further, the MC sheet 2, after leaving the cartridge 3, is transported inside the main case 15 while being preserved in the unexposed condition by the lightproof cover, etc. Moreover, the present embodiment is applicable to MC sheets 2 of a plurality of sizes equal to or smaller than A6; however, the constitution of the MC sheet 2 will be explained below.

Next, the transport mechanism 25 for transporting the MC sheet 2 will be explained.

As shown in FIGS. 1 and 2, the transport mechanism 25 comprises one pair of transport rollers 26 provided in the vicinity of the sheet feeding roller 23 and one pair of discharge rollers 27 provided in the vicinity of the sheet discharge opening 16, wherein the sheet transport path 28 is formed in a straight line linking the contact point of the one pair of transport rollers 26 and the contact point of the one pair of discharge rollers 27. I.e., the transport rollers 26 and the discharge rollers 27 are driven by a stepping motor 105 for sheet transport (refer to FIG. 13) via a gear system, whereby the MC sheet 2 fed by the sheet feeder mechanism 22 is transported forward along the before-mentioned sheet transport path 28, and discharged through the sheet discharge opening 16 to the outside of the main case 15. In addition to the transport rollers 26, further transport rollers may be provided according to need.

Next, the heating mechanism 40, the exposure mechanism 50, and the ball developing mechanism 70 will be explained.

As shown in FIGS. 1 and 2, the heating mechanism 40 comprises a film heater 41 for preheating, provided so as to face the exposure bed 52 of the exposure mechanism 50 from predominantly thereunder, and a film heater 42 for heat-fixing, provided in the vicinity of the discharge rollers 27, wherein the unexposed MC sheet 2 fed from the cartridge 3 is preheated by the film heater 41 to about 45–50° C. before the latent image is formed by the exposure mechanism 50, and the MC sheet 2 is then heat-fixed by the film heater 42 for heat-fixing to about 80–100° C. after a latent image has been formed by the exposure mechanism 50 and developed by the ball developing mechanism 70.

The exposure mechanism 50 comprises a carriage 51 driven to move in a left and right direction, an exposure bed 52 mounted to the carriage 51, an exposure table 53 facing the exposure bed 52 so as to sandwich the sheet transport path 28 therebetween, etc., wherein the exposure bed 52 mounted to the carriage 51 forms a latent image on the MC sheet 2 by exposure based on image information by moving back and forth, together with the carriage 51, in the left and right direction (the direction perpendicular to the plane of the drawing), while facing the sheet transport path 28 from above in close proximity thereto.

The exposure table 53 is pressed upward by springs (pressing means) 53a, while the film heater 41 for preheating of the before-mentioned heating mechanism 40 is provided on the upper face of the exposure table 53, and the exposure table 53 brings the MC sheet 2 into contact with the lower face of the exposure bed 52 via the film heater 41 for preheating with a pressing force that will permit the MC sheet 2 to be transported.

The before-mentioned carriage 51 while freely sliding is guided by a guide rod 54 in a horizontal direction at right angles to the transport direction of the MC sheet 2, and engaging a threaded shaft 55, provided in parallel with the guide rod 54, to which it is linked, it moves in the left and right direction by the circular movement of the threaded shaft 55. As shown in FIG. 2, a drive mechanism 56 for imparting a rotational movement to the threaded shaft 55 comprises a stepping motor 57 provided in the vicinity of the right side of the threaded shaft 55, a timing pulley 57a fixed to the output axis of the stepping motor 57, a timing pulley 55a fixed to the right end of the threaded shaft 55, and a timing belt 58 wound on these timing pulleys 57a and 55a, wherein, by the drive of the stepping motor 57, the threaded shaft 55 is moved in a circular direction, and the carriage 51 is driven to move in the left and right direction.

Meanwhile, the before-mentioned film heater 41 for preheating, wherein a pattern of conductive heating elements is formed by printing or some other means on a thin film of polyimide or some other material, is made so that the film itself heats up when an electric current is applied to the conductive heating elements, and by heating the MC sheet 2 to about 45–50° C. the sensitivity of the exposure, which takes place immediately afterward, is increased. Further, like the film heater 41 for preheating, the film heater 42 for heat-fixing, wherein a pattern of conductive heating elements is formed by printing or some other on a thin film of polyimide or some other material, is also made so that the film itself heats up when an electric current is applied to the conductive heating elements, and by heating the MC sheet 2, which has gone through pressure development, and on which a color image has appeared, to about 80–100° C., the microcapsules of the MC sheet 2 are completely hardened, and the excess dye precursor inside the plurality of microcapsules is fixed and confined inside the microcapsules.

Figure 5:
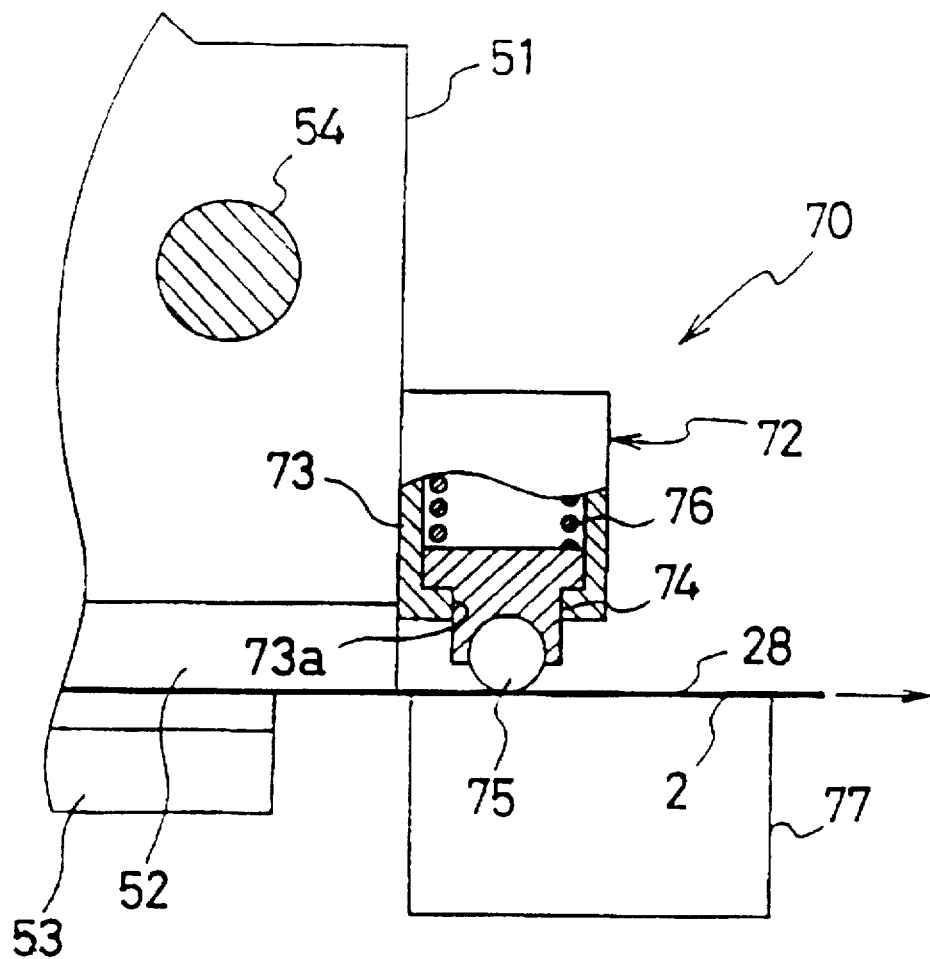
FIG. 5 is a partial view in cross section of the ball developing mechanism.

As shown in FIGS. 1 and 5, the ball developing mechanism 70 comprises a ball developing apparatus 72 fixed to the carriage 51 and moving back and forth together with the carriage 51, and a developing platform 77 positioned so as to face the sheet transport path 28 with its upper face, wherein a point contact ball 75 provided at the ball developing apparatus 72 is pressed downward by a spring (pressing means) 76, and wherein by moving the point contact ball 75 together with the carriage 51 in the left and right direction, a predetermined pressure is applied to the MC sheet 2 by the point contact ball 75 on top of the developing platform 77, whereupon the latent image formed on the transported MC sheet 2 is developed.

The before-mentioned point contact ball 75 is maintained at the tip of a ball-bearing member 74 so that it can rotate freely. This ball-bearing member 74 is formed as a stepped cylinder, the wider upper part of which is inserted into the holder 73 fixed to the carriage 51, so that it can slide freely therein, while the tip of the ball-bearing member 74 protrudes downward from the opening 73a of the holder 73. A spring 76 is fitted inside the holder 73 above the ball-bearing member 74, and the point contact ball 75, pressed downward via the ball-bearing member 74, is brought into pressure contact with the developing platform 77 so that it can rotate.

As described above, in the printer 1, the unexposed MC sheet 2 fed from the cartridge 3, while being transported, is preheated by the film heater 41 to about 45–50° C. to increase the sensitivity in relation to the exposure which takes place immediately afterward, after which the MC sheet 2, while passing the exposure mechanism 50, is exposed by means of the exposure bed 52 scanning back and forth in a direction perpendicular to the plane of the drawing (the main scanning direction), whereupon latent images corresponding to the red, green and blue components of a color image are formed on the MC sheet 2. Thereafter, the MC sheet 2, while passing the ball developing mechanism 70, is pressed on the developing platform 77 by the point contact ball 75, whereupon the latent image is developed, and after heat-fixing while passing the film heater 42, the MC sheet 2 on which a color image based on image information has been recorded is discharged from the printer 1 by the discharge rollers 27 via the sheet discharge opening 16.

Next, the MC sheet 2 (microcapsule sheet) will be explained.

Figure 6:
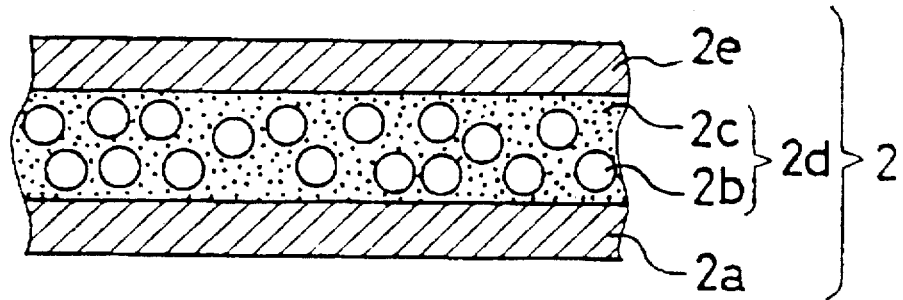
FIG. 6 is a schematic view showing a microcapsule sheet in cross section.

As shown in the cross section of the MC sheet 2 represented in FIG. 6, a mixed coating layer 2d, formed, e.g., on the surface of a white sheet support 2a, comprises a co-reactant (color developing material) 2c reacting with a dye precursor (chromogenic material) inside the microcapsules 2b, and a plurality of microcapsules encapsulating a polymerization initiator and photocurable resin that undergoes a change of mechanical strength when irradiated with light of a predetermined wavelength, a dye precursor (also called "chromogenic material" below) as coloring material for coloring when brought into contact with the co-reactant (color developing material) as coloring material, while a light-transmitting support 2e is formed on top of the mixed coating layer 2d.

The before-mentioned plurality of microcapsules 2b comprises three different types of microcapsules in equal parts. The three types of microcapsules encapsulate the polymerization initiator and photocurable resin photocuring by irradiation with light of any one of the three primary colors of light, and the colorless dye precursors for producing each of the colors yellow, magenta and cyan. E.g., when exposing the MC sheet 2 to blue light (with a wavelength of about 470 nm), the photocurable resin forming the microcapsules containing only yellow dye precursors is photocured, and these microcapsules (yellow) do not rupture even when pressure developing the MC sheet 2; however, the microcapsules which were not photocured (magenta and cyan) rupture, and the magenta and cyan dye precursors are forced out from the microcapsules 2b and react with the color developing material 2c, whereupon coloring occurs, and these colors mix to become a blue color, whereupon this blue color can be seen through the light-transmitting support 2e.

Further, when exposing the MC sheet 2 to green light (with a wavelength of about 525 nm), the photocurable resin of the microcapsules containing only magenta dye precursors is photocured, the yellow and cyan microcapsules are ruptured by pressure development, and as a result of the reaction of the color developing material with the yellow and cyan dye precursors the respective coloring occurs, whereupon these colors mix to become a green color.

Moreover, when exposing the MC sheet 2 to red light (with a wavelength of about 650 nm), the photocurable resin of the microcapsules containing only cyan dye precursors is photocured, the yellow and magenta microcapsules are ruptured by pressure development, and as a result of the reaction of the color developing material with the yellow and magenta dye precursors the respective coloring occurs, whereupon these colors mix to become a red color.

Furthermore, when all microcapsules are photocured by exposure to light corresponding to the 3 types of microcapsules previously mentioned, they do not rupture even by pressure development, therefore coloring does not occur, and the surface of the sheet support 2a can be seen through the light-transmitting support 2e, i.e. the sheet support 2a surface color (white in the present embodiment) becomes the background color. In short, a color image is formed only in the areas where a coloring reaction occurred when the microcapsules 2b ruptured. This coloring principal is called "self-coloring", and the surface of the light-transmitting support 2e of the MC sheet 2 is called "coloring side".

In the case of the present embodiment, resin film made of PET (polyethylene terephthalate), polyvinylchloride, etc., can be used as the before-mentioned light-transmitting support 2e; triphenylmethane dye and spiropyran dye can be used as chromogenic material encapsulated in the microcapsules 2b; the microcapsules 2b themselves can be made of such polymers as gelatin, polyamide, polyvinyl alcohol, polyisocyanate resin, etc.; compounds containing acryloyl groups such as trimethylolpropane triacrylate, etc., can be used as photocurable resin; and benzophenone, benzoyl alkyl ether, etc., can be used as photo-polymerization initiator.

The before-mentioned co-reactant 2c (color developing material) depends, among other things, on the composition of the chromogenic material inside the microcapsules 2b; however, known color developing materials such as acid substances as for example inorganic oxides such as acid clay, kaolin, zinc oxide, titanium oxide, etc., phenol novolac resin, or organic acid, etc., can be used as co-reactant 2c. In addition to the microcapsules 2b and the co-reactant 2c, a binder, a filler, a viscosity adjusting agent, etc., can further be added to the mixed coating layer 2d, which can be formed on the light-transmitting support 2e by means of a roll coater, spray coater, knife coater, etc. A transparent, translucent or opaque support such as, e.g., cellulose or synthetic paper, or resin film made of polyester, polycarbonate, etc., can be used as sheet support 2a.

Next, based on FIG. 7, the image forming area (developing area) and the peripheral area (undeveloped area) of the MC sheet 2, the constitution of which has been described above, will be explained.

Figure 7:
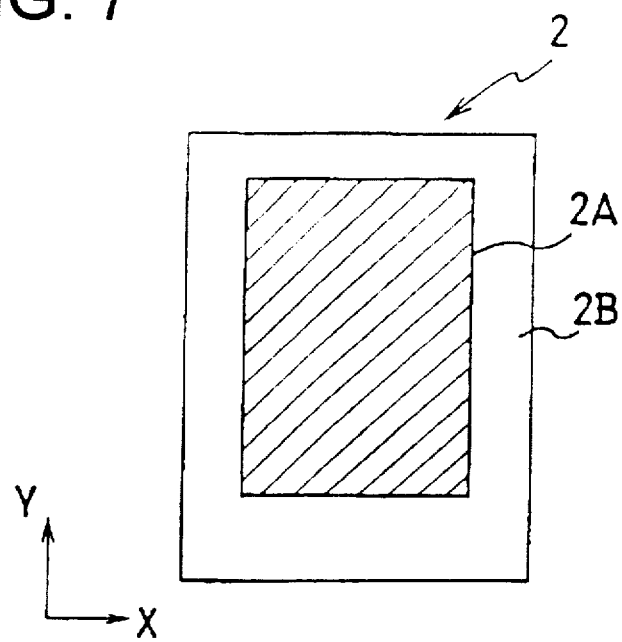
FIG. 7 is an explanatory view showing the areas of a microcapsule sheet.

If in FIG. 7, which is a top plan view of the MC sheet 2, the MC sheet 2 is transported in the Y direction along the transport path of the printer 1, and if at least the exposure bed 52 moves back and forth in the X direction of FIG. 7, an image forming area 2A for forming a high quality image and a peripheral area 2B surrounding the image forming area 2A are formed on the MC sheet 2. The peripheral area 2B is the area where it is not possible to form a high quality image, as in the image forming area 2A, when forming an image on the MC sheet 2.

One method of forming the peripheral area 2B is to expose only the peripheral area 2B to strong white light beforehand, whereby all of the microcapsules of this area are thoroughly cured. And since the microcapsules which have been cured beforehand in this way do not rupture by pressure development, the dye precursor necessary for the image development is not released, and the peripheral area 2B becomes a white frame.

Furthermore, instead of the exposure described above, the peripheral area 2B can also be exposed beforehand to a simple pattern with a light of a predetermined wavelength. The peripheral area 2B can be pressure developed at the same time as exposing and pressure developing the desired high quality image in the image forming area 2A, and the peripheral area 2B can also be developed before the desired image is exposed. Alternatively, it is also possible to form the peripheral area 2B and the image forming area 2A in the same way and then only expose and pressure develop the image forming area 2A. However, with this method the MC sheet 2 has to be handled with care because of the rupturable microcapsules remaining in the peripheral area 2B (undeveloped area). Hence, it is desirable to expose the peripheral area 2B to white light before the exposure of the desired high quality image, or after the image is formed.

Next, the exposure bed 52 of the exposure mechanism 50 will be explained.

Figure 8A:
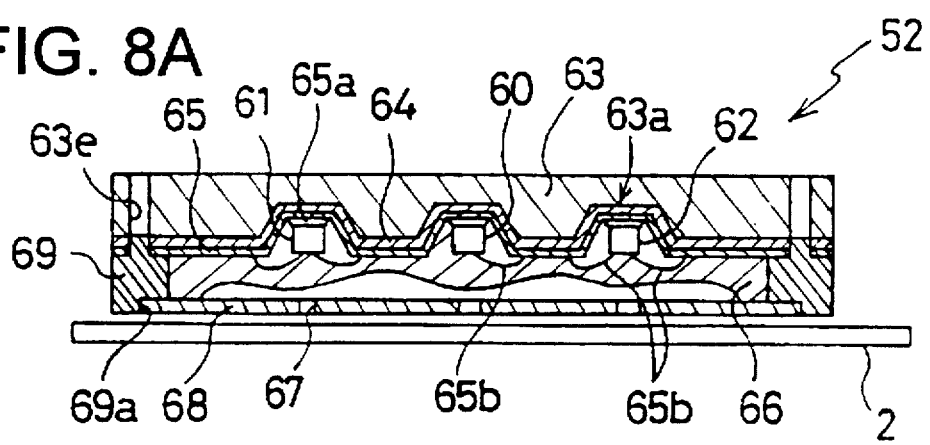
FIG. 8A is a side view in cross section showing the exposure bed.
Figure 8B:
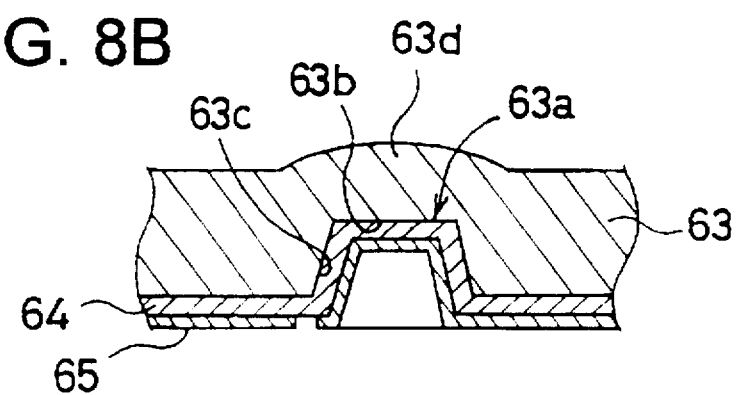
FIG. 8B is an enlarged side view in cross section showing the concave portion of the exposure bed substrate.
Figure 9:
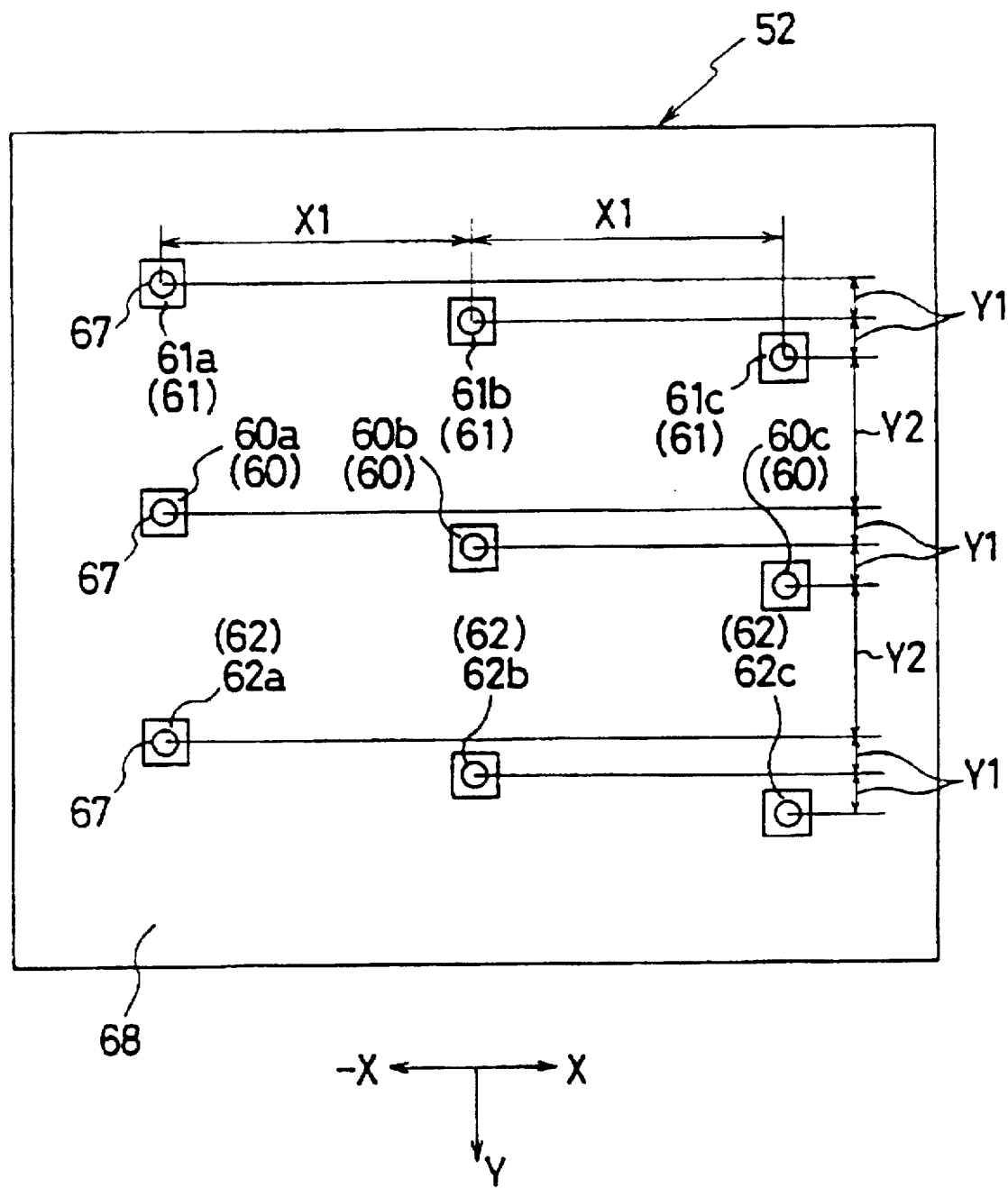
FIG. 9 is an enlarged bottom view of the exposure bed.

FIG. 8A is a view in cross section of the exposure bed 52 for exposing the MC sheet 2. FIG. 8B is an enlarged view also in cross section of the concave portion 63a of the exposure bed 52, and FIG. 9 is a bottom view of the exposure bed 52 which comprises a plurality of light emitting elements 60, 61, and 62 (9 elements in the present embodiment) and a substrate 63 for supporting these elements. In the exposure bed 52, a white polyimide insulating layer 64 (with about 100 μm thickness) is formed on the surface of the flat aluminum substrate 63, and an electrode layer 65 for transmitting electrical signals is formed with a predetermined land pattern, in plan view, by printing on the surface of the insulating layer 64. The electrode layer 65 is made from a 35 μm copper layer, a 5 μm nickel layer and a 0.5–1.0 μm gold layer. In this way, the required number of concave portions 63a is formed in the substrate 63 so as to correspond to the predetermined places of the electrode layer 65 formed in accordance with a predetermined pattern, and in each of the concave portions 63a LEDs 60 to 62 are mounted as light emitting elements.

Which means that, as shown in FIG. 8B, in cross section, a cone-shaped concave portion 63a is formed by precision pressing of the substrate 63 by a known fine blanking method using a predetermined die (not shown in the drawing), in which a concave part is formed which corresponds to the protrusion corresponding to each concave portion 63a and to the convex portion 63d as material recess at the underside of the concave portion 63a. In this embodiment, the ceiling 63b of each concave portion 63a is formed in parallel with the surface of the substrate 63, and the side faces 63c of each concave portion 63a are inclined from the ceiling 63b so as to widen toward the bottom. The insulating layer 64 on the surface of the substrate 63 and the electrode layer 65 are also formed in accordance with a predetermined pattern along the surface of the concave portion 63a, and the depth of each concave portion 63a is formed so as to be greater than the mounting height of the LEDs 60 to 62.

Further, the red LED 60, green LED 61, and blue LED 62 are provided at the surface of the electrode layer 65 at the ceiling 63b of the concave portion 63a and fixed by a adhesive 65a. And since here the depth of the concave portion 63a is a little greater than the mounting height of the LEDs 60 to 62, the underside of the LEDs 60 to 62 does not protrude beyond the surface of the substrate 63. From the underside of the red LED 60, the green LED 61 and the blue LED 62 an electrical connection is made by a bonding wire 65b at predetermined positions of the land patterned electrode layer 65; these LEDs and the bonding wire 65b are sealed by a transparent sealing material 66 so as not to come into contact with air.

As adhesive 65a, silver paste is used for the red LED 60 and epoxy resin, etc., is used for the green LED 61 and blue LED 62. This is because, contrary to the red LED 60 whose upper face forms one of the electrical terminals and for which it is therefore necessary to use a conductive adhesive to make contact with the substrate 65, the terminals for the green LED 61 and the blue LED 62 are both situated at their respective lower faces, for which reason they are glued on with an insulating transparent epoxy resin. Because of using a transparent adhesive 65a, the emitted light, generated inside the green LED 61 and the blue LED 62, which radiates toward the ceiling 63b, passes through the transparent adhesive 65a and being reflected by the ceiling 63b is again emitted, this time toward the bottom, with the effect that the strength of the emitted light is increased.

A material based on AlGaAs and the known high output DDH structure can be used for the red LED 60. The center wavelength of the emitted light of the red LED 60 is about 650 nm. One electrical terminal is at the upper face and one electrical terminal is at the lower face. For the green LED 61 and the blue LED 62 a material based on GaN can be used. The center wavelength of the emitted light is 525 nm and 470 nm respectively. The green LED 61 and the blue LED 62 have 2 electrical terminals each at the lower face and no terminal at the upper face. By passing an electric current in a predetermined direction through those two terminals, the emitted light radiates in all directions; a portion thereof radiates directly toward the bottom, in the drawing, another portion is first reflected at the side faces 63c of the concave portion 63a and is then radiated toward the bottom in the same manner.

The bonding wire 65b, made from gold wire, is bonded by means of heat and ultrasonic waves to the top face of each LED and to the electrode layer 65. The sealing material 66 is made from thermosetting resin (e.g., transparent silicon resin, JCR, etc.). Thermosetting typically takes place within approximately one hour at 150° C. When generic semiconductor elements such as LEDs, etc., come into contact with air, their surface oxidizes, and by the effect of moisture absorption, etc., their properties deteriorate; therefore the sealing material 66 has the function to prevent this deterioration and to protect the bonding wire 65b, etc., from mechanical shock.

At the underside of the substrate 63, a mask 68 having a plurality of pin holes 67 is provided and positioned by means of a mask support 69. The mask support 69 is fixed by insertion into the fitting holes 63e of the substrate 63 used for positioning, and the mask 68 is fitted into a positioning groove 69a, formed at the underside of the mask support 69 for supporting the mask 68, and can be fixed by adhesives, screws, etc., in a solid connection with the substrate 63. In the present embodiment, the mask 68 is solidly connected to the substrate 63 by means of the sealing material 66.

The mask support 69 is a molded product made from a high precision heat resistant plastic material, and using the fitting holes 63e for positioning of the substrate 63 as reference, the mask 68 is positioned in three directions. When positioning and bonding the mask support 69 and the mask 68 at the same time with thermosetting resin as sealing material 66, it is necessary to use heat resistant material for the mask support 69, so that it is not deformed by the setting temperature of the sealing material 66.

The before-mentioned mask 68 is made as a thin stainless steel sheet with a thickness of about 0.1 mm, its external shape and the pin holes 67 are formed by an etching process, and its surface is blackened by means of a dipping method so as not to reflect light. The pin holes 67 have a diameter of 0.18–0.25 mm (about 0.007–0.010 inch). This diameter determines the resolution of the light pattern supplied to the MC sheet 2. The plurality of pin holes 67 is formed so as to be opposite the top face of the red LED 60, the green LED 61 and the blue LED 62 respectively.

Here, a plurality of LEDs form one set of LEDs 60a to 60c for red, one set of LEDs 61a to 61c for green, and one set of LEDs 62a to 62c for blue, and the relation between the positions of these LEDs is shown in FIG. 9, wherein the distance X1 in the direction of the back and forth movement of the exposure bed 52 (the ±X direction in FIG. 9) is an integer multiple of one pixel (1 dot) of the image formed on the MC sheet 2 (e.g., X1 is a length of 16 dots), and the distances Y1 and Y2 in the transport direction (the Y direction in FIG. 9) of the MC sheet 2 are integer multiples of one pixel (e.g., Y1 is a length of 1 dot and Y2 is a length of 10 dots). With a length of twelve dots, (2 Y1+Y2) is set to an integer multiple of the number of installed LEDs for each color (3). Furthermore, the relation between the positions of the pin holes 67 formed in the mask 68 is identical to that of the LEDs 60 to 62 mentioned above.

During exposure, the exposure bed 52 is moved back and forth at a predetermined speed in the ±X direction in FIG. 9, while the MC sheet 2 is transported forward in the Y direction also in FIG. 9 (the direction toward the left in FIG. 1 and 2), and the surface of the MC sheet 2 and the mask 68 are kept close to each other. In this way, by the scanning movement, each set of LEDs, 60 to 62, selected based on image information, is independently driven by modulation; and by supplying a light of a predetermined center wavelength at a predetermined light energy for a predetermined amount of time to each pixel, a latent image of a color image is formed on the MC sheet 2.

Next, the exposure process for forming a latent image by the back and forth scanning movement of the exposure bed 52, while the MC sheet 2 is transported, will be explained in detail.

As shown in FIGS. 1 and 2, the MC sheet 2 is exposed on its surface side (the side of the light-transmitting support 2e) by the exposure bed 52. The exposure bed 52, which comprises the mask 68 with the pin holes 67, the mask support 69 and the substrate 63, is mounted on the carriage 51, which is fitted so that it can move back and forth along the guide rods 54 which are at right angles to the transport direction of the MC sheet 2, and is moved back and forth by a drive system, which includes the stepping motor 57, so as to cover the entire width of the image forming area 2A of the MC sheet 2.

Figure 10:
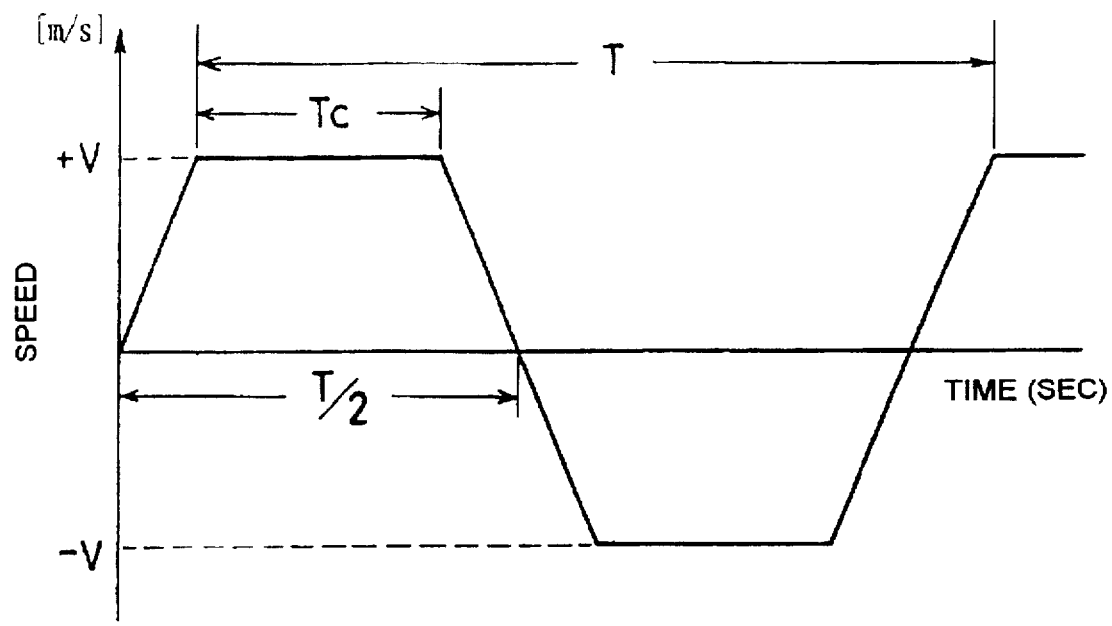
FIG. 10 is a diagram of the scanning speed and other characteristics of the exposure bed.

FIG. 10 is a diagram showing the variations in time of the scanning speed of the carriage 51, which, having a maximum speed V (m/sec), a scan cycle T (sec), and a constant speed duration Tc (sec), is driven back and forth in a trapezoidal shaped pattern of speed variations. As shown in FIG. 10, the carriage 51 is moved back and forth in the ±X direction of FIG. 2 at a maximum constant scanning speed ±V (m/sec). The inclined portion on the time axis in FIG. 10 represents the acceleration and deceleration between the maximum constant scanning speed ±V and a momentary halt at the end of the back and forth movement. Moreover, the duration Tc is the time required for the carriage 51 to pass the distance of the width (in the ±X direction) of the image forming area 2A of the MC sheet 2 at the maximum constant scanning speed, and the duration T is the scan cycle.

While the MC sheet 2 is transported in the Y direction of FIG. 9 and the exposure bed 52 scans back and forth in the ±X direction of FIG. 9, each exposure line (one dot line along the ±X direction of FIG. 2) of the MC sheet 2 is exposed, first by the green LED 61, next, after the MC sheet 2 has been transported by an amount of twelve pixels, by the red LED 60, and next, after the MC sheet 2 has again been transported by an amount of twelve pixels, by the blue LED 62. And then, when exposing each pixel of each exposure line by the green LED 61, the same pixel is exposed three times by the three LEDs 61a to 61c. Exposure by the red LEDs 60a to 60c and exposure by the blue LEDs 62a to 62c takes place in the same way.

Figure 11:
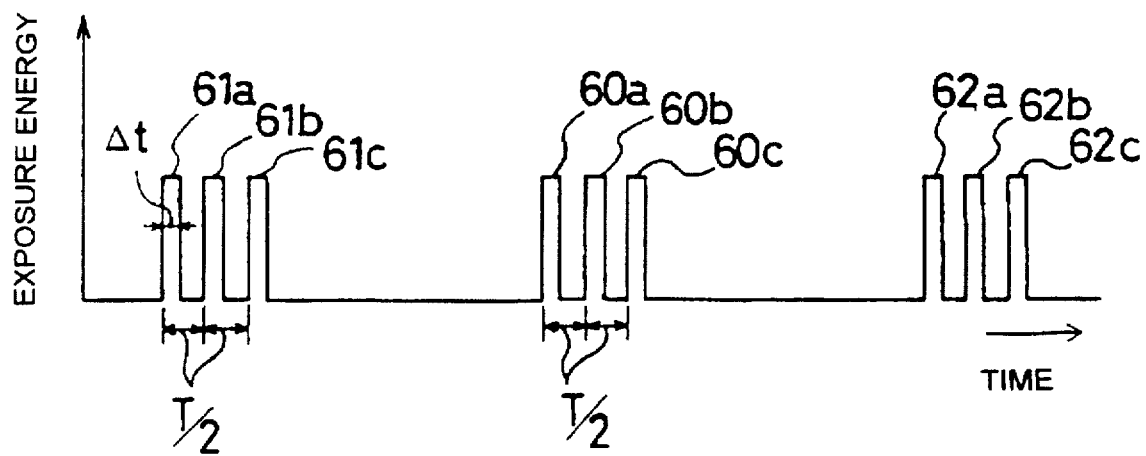
FIG. 11 is a time chart of the exposure of one and the same pixel.

Next, this will be explained concretely while focusing on one pixel of the MC sheet 2; when, for example, coloring this one pixel white, it is illuminated by green, red, and blue light. First, during exposure by the green LEDs 61, the carriage 51 is moved in the forward direction (e.g., the +X direction), and when the pin hole 67 corresponding to the green LED 61a is positioned over the before-mentioned pixel, the green LED 61a is switched on one time for a predetermined short duration Δt only, next, the carriage 51 is stopped once at the end of the forward movement, and after the MC sheet 2 has been transported in the Y direction of FIG. 9 by an amount of one dot only, the carriage 51 is moved in the backward direction (e.g., the −X direction), and when the pin hole 67 corresponding to the green LED 61b is positioned over the before-mentioned pixel, the green LED 61b is switched on one time for a predetermined short duration Δt only, next, the carriage 51 is stopped once at the end of the backward movement, and after the MC sheet 2 has been transported in the Y direction of FIG. 9 by an amount of one dot only, the carriage 51 is moved in the forward direction and when the pin hole 67 corresponding to the green LED 61c is positioned over the before-mentioned pixel, the green LED 61c is switched on one time for a predetermined short duration Dt only, after which the carriage 51 is stopped once at the end of the forward movement. In this way, as shown in FIG. 11, at each half duration of the scan cycle T, a green LED is switched on in the order 61a, 61b, and 61c over one pixel for a short duration Δt each.

Next, after the MC sheet 2 has been transported by an amount of twelve pixels (twelve dots) only in the Y direction, exposure by the red LEDs 60 takes place three times by the red LEDs 60a, 60b, and 60c, one after the other, in the same way as described before, and then, after the MC sheet 2 has again been transported by an amount of twelve pixels only in the Y direction, exposure by the blue LEDs 62 takes place three times by the blue LEDs 62a, 62b, and 62c, one after the other, in the same way as described before. By the above method, as shown in FIG. 11, exposure of the before-mentioned one pixel takes place three times for each of the three colors. As a result, the microcapsules for the three colors of this one pixel are photocured and coloring does not occur, whereupon the pixel takes on the white color of the sheet support 2a background.

Figure 12:
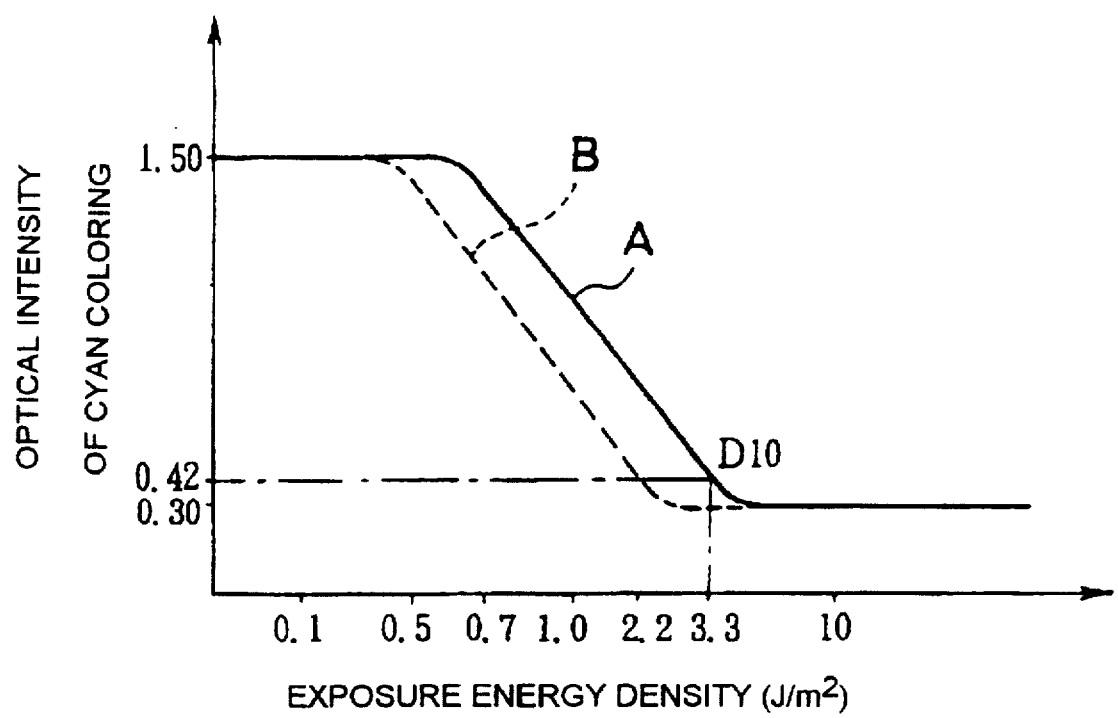
FIG. 12 is a curve showing the characteristics of the exposure energy density corresponding to the optical intensity of cyan coloring.

Thus, since the exposure of the same pixel of the MC sheet 2 takes place three times for each color within a time interval of half the scan cycle T, it is possible to increase the sensitivity of the coloring and to change the luminous intensity of the coloring at a low luminous radiant energy density. In FIG. 12, the optical intensity of the cyan coloring is plotted along the vertical axis, and the total amount of the exposure energy density (J/m$^2$) is plotted along the horizontal axis. The full line A shows the variations of the optical intensity of the cyan coloring when the red LED 60 emits light only one time, and the dotted line B shows the variations of the optical intensity of the cyan coloring when the emission of the red LED 60 is divided into 3 times separated by a time interval of half the scan cycle T.

In FIG. 12, to obtain a cyan coloring with an optical intensity of 10%, i.e. D 10=0.42, an exposure energy density of 3.3 J/m$^2$ emitted at 1 time is necessary; however, when dividing the emission into three times, as described before, a total exposure energy density of 2.2 J/m$^2$ is sufficient. It is clear from FIG. 12 that to obtain the same optical intensity of the cyan coloring, in the range of exposure energy densities from 0.5 to 3.3 J/m$^2$, a low exposure energy density is sufficient when dividing the emission of light into three times, whereas a high exposure energy density is required when emitting only one time. The same is true for yellow and magenta.

The reason for this is that, since the speed of the polymerization reaction which occurs during irradiation by light between the polymerization initiator and the photocurable resin of the microcapsules 2b of the MC sheet 2 is not very high, for accelerating the reaction process it is better to apply the exposure energy divided into a plurality of times (e.g., two to six times) a little at a time with suitable time intervals, rather than to apply a great amount of exposure energy one time. In other words, even when reducing the output power of each LED, or when the number of installed LEDs is small, it is still possible to obtain a sufficient degree of optical intensity of the coloring.

Furthermore, it is desirable that exposure and development of the MC sheet 2, at least in the image forming area 2A thereof, take place at a constant speed. Therefore, the displacement distance L (m) at a constant speed corresponding to the shortest constant speed duration Tc required for exposing and developing the MC sheet 2 is at least so that all pin holes 67 pass the image forming area 2A. This constant speed displacement distance L (m) can be chosen at will, taking into consideration the image forming area 2A, the alignment pattern of the pin hole 67 and the maximum speed V (m/sec). For example, with L=0.1118 m and V=0.86 m/sec it is possible to expose the whole surface of an A6 size MC sheet 2.

Next the control unit 90 of the printer 1 will be explained.

Figure 13:
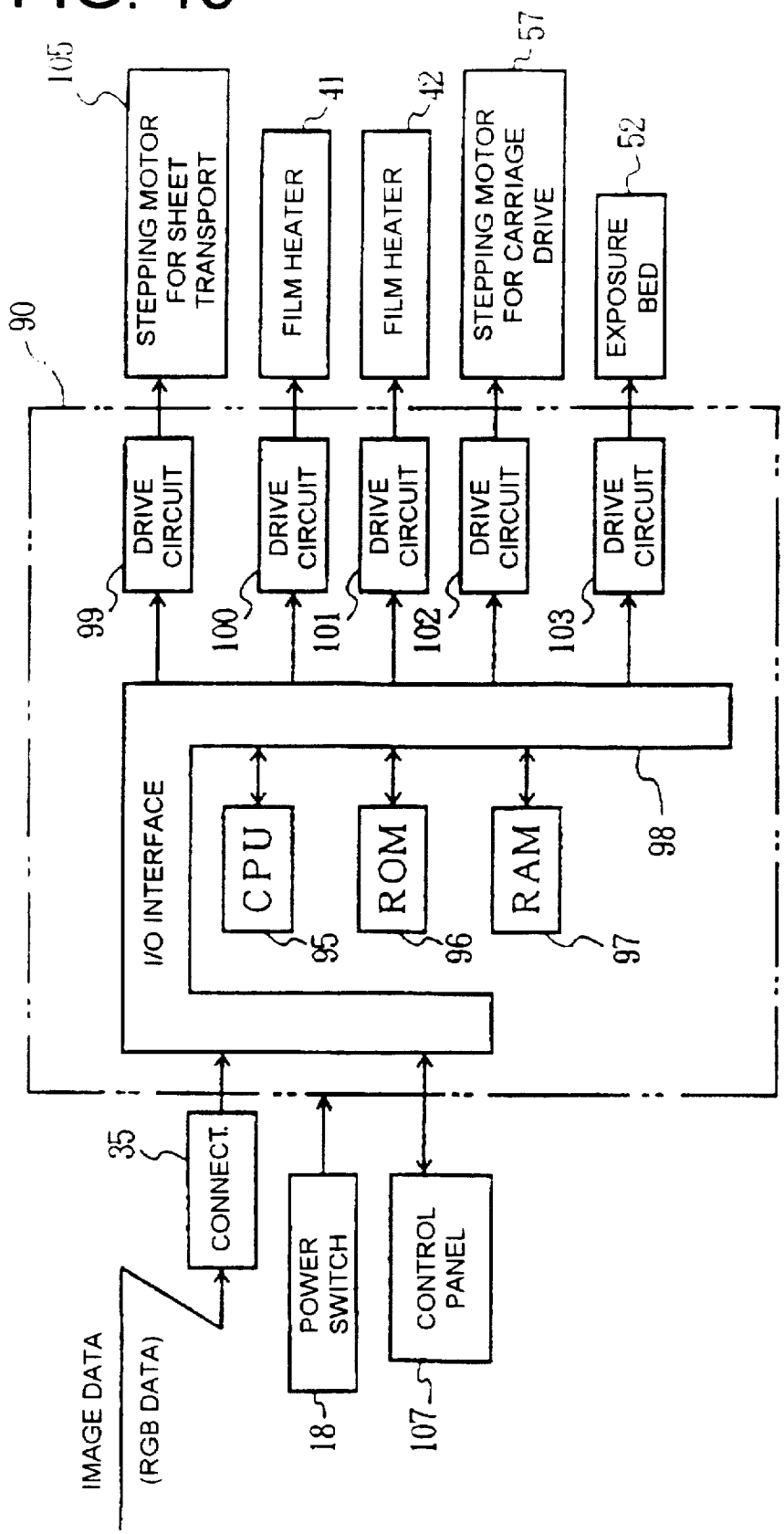
FIG. 13 is a block diagram showing the control system of a photo and pressure sensitive printer.

As shown in FIG. 13, the control unit 90 comprises a computer comprising a CPU 95, a ROM 96 and a RAM 97, an I/O interface 98, and drive circuits 99 to 103, wherein a stepping motor 105 for sheet transport, film heaters 41 and 42, a stepping motor 57 for driving the carriage, the exposure bed 52, etc., are respectively connected to the drive circuits 99 to 103. A power switch 18, a connector 35, and a control panel 107 are also connected to the control unit 90, and image data (RGB image data) from an external host computer are fed via a connector mechanism 30, including a connector 35, to the control unit 90.

The ROM 96 stores control programs for controlling all operations of the printer 1, a control program for calculating, from the input image data, the duration for which each LED of the exposure bed 52 is turned on and the timing thereof, a control program for controlling the transport of the MC sheet 2 by controlling the stepping motor 105 for sheet transport synchronously with the exposure to green, red and blue light, a control program for controlling the scanning of the exposure bed 52 by controlling the stepping motor 57 for driving the carriage synchronously with the exposure to green, red and blue light, etc.

The different buffers and memory types necessary for running the before-mentioned control programs are in the before-mentioned RAM 97, and the number of copies to be printed, the enlargement or reduction ratio of the image, the size of the image forming area 2A of the MC sheet 2, etc., input by an operator at the control panel 107, are stored in the memory of the RAM 97. Exposure takes place upon calculation of the driving conditions for the stepping motor 57, driving the carriage, based on the data of the size of the image forming area 2A.

When image data of an image is sent to the control unit 90, this image data is divided into R image data, G image data, and B image data and stored in a buffer of the RAM 97. Each LED of the exposure bed 52 is electrically driven by the drive circuit 103 via a flexible cable.

Next, the light utilization efficiency of the exposure bed 52 will be explained with the help of a numerical example.

Figure 14:
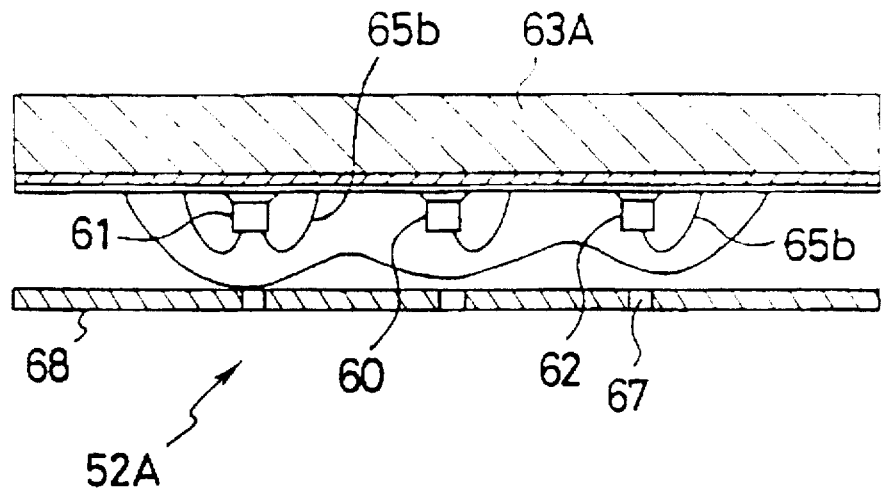
FIG. 14 is a side view showing a prior art exposure bed in cross section.

FIG. 14 shows the typical structure of the exposure bed 52A of a conventional printer in cross section, different from the before-mentioned exposure bed 52, in that there are no concave portions in the substrate 63A, and in that the LEDs 60 to 62 are mounted to the surface of the substrate 63A. The light energy output from the red LED 60, when driven by an electrical current of 20 mA at normal temperature, is 2 mW for all light beams. Further, the chip size of the red LED 60 is a square of 0.3 mm by 0.2 mm height (about 0.0118× 0.0118×0.0079 inch). For a red LED 60 mounted to the flat substrate 63A, as shown in FIG. 14, the light energy emitted from the pin hole 67 of the mask 68 at a distance of 1 mm (0.039 inch) from the top face of the chip is, at identical driving conditions, 64 µW, which represents a light utilization efficiency of 3.2%. The light utilization efficiency of the green LED 61 and the blue LED 62 is almost identical.

By comparison, with a substrate comprising the concave portion 63a as in FIG. 8, the light energy emitted from the pin hole 67 of the mask 68 at a distance of 1 mm (0.039 inch) from the top face of the chip is, at identical conditions, 120 µW; thus, almost doubling the light utilization efficiency to 6.0%. Substantially the same advantageous effect is obtained with the green LED 61 and the blue LED 62. This light utilization efficiency can be further increased by reducing the coarseness of the side faces 63c and by giving the shape of a reflecting mirror with a free curved surface thereto.

Next, the stray light not used for the image formation will be explained.

Since all the LEDs are mounted to the surface of the flat substrate 63A in the exposure bed 52A without concave portion, as shown in FIG. 14, the light emitted by the red LED 60 in horizontal direction is directly projected onto the green LED 61 and the bonding wire 65b connecting the green LED 61 and reflected therefrom, and then being emitted from the pin hole 67, from which the green light ought to be emitted, results in the so-called problem of stray light, whereby the image quality of the color image deteriorates significantly. By comparison, when using an exposure bed 52 like the one shown in FIG. 8, the light emitted from the red LED 60 is not directly projected onto the green LED 61 because of the side faces 63c of the concave portion 63a, and the light that is not directly emitted through the pin hole 67 is absorbed by the back of the mask 68 because of a non-reflection treatment that has been applied to the back of the mask 68, whereby the image quality is significantly improved.

Regarding the adhesive height and the length of the before-mentioned bonding wire 65b, when performing the bonding process of the exposure bed 52 of the present embodiment with a wire bonder (bonding robot), the operation of the bonding robot can be simplified, and other advantageous effects can be achieved, because the length of the bonding wire 65b is reduced, and the bonding positions are predominantly at the same height. Further, for improving the light utilization efficiency it is advantageous to dimension the concave portions 63a in FIG. 8 so small that each of the LED chips will just fit into them, and because of this it is also advantageous to position the bonding pads (the connecting positions of the wire 65b) in the land patterned electrode layer 65 in places other than the concave portions 63a. This is also advantageous in cases where it is difficult to form the land pattern of the electrodes on the ceiling 63b or side faces 63c of the concave portion 63a, when it is necessary to form small and relatively deep concave portions 63a.

Coming now to the required energy density for the before-mentioned photosensitive recording material, the energy density necessary for photocuring the microcapsules 2b of the MC sheet 2 is about 3 J/m², which is about 300 times that required for silver salt photographs with a sensitivity of 0.1 J/m². Thus, compared with the energy applied to the sensitive material in typical photography, etc., the energy required for the exposure of the MC sheet 2 is very high. For implementing the exposure of the MC sheet 2 with the printer 1 of the present embodiment, according to a simple calculation using a write cycle of 100%, forty-two of the before-mentioned red LEDs 60 are required to expose 1 m² in 600 seconds, since the energy that can be supplied by one red LED 60 is 120 µW. Compared to this, with the exposure bed 52A without a concave portion, as in FIG. 14, twice as many, i.e. eighty-four red LEDs 60 are necessary.

Next, the development process for developing the latent image, formed on the MC sheet 2 by means of the developing mechanism 70, will be explained. When exposing the microcapsules 2b of the MC sheet 2, they are photocured; however, the strength of the unexposed microcapsules 2b remains very low, and when the MC sheet 2 is pressed on the developing platform 77 by the point contact ball 75 moving back and forth in the left and right direction together with the carriage 51 in the ball developing mechanism 70, only the unexposed microcapsules 2b are ruptured, and the dye precursor flowing out from inside the microcapsules 2b reacts with the color developing material 2c, whereupon coloring occurs.

Next, the operation and effect of the printer 1 will be explained.

For clearing a paper jam when the MC sheet 2 is not transported correctly, or for the maintenance of the image forming unit comprising the heating mechanism 40, the exposure mechanism 50, and the ball developing mechanism 70, it is necessary to frequently remove the main case 15, into which this image forming unit is integrated, from the storage bay 7; however, since the outer case 10, slid into and fitted while inside the storage bay 7 of the computer 5, is provided, and since the main case 15 is inserted into this outer case 10 so as to be removable, the main case 15 can be smoothly inserted into and removed from the outer case 10.

Further, since 1 pair of slides 12 is provided for supporting the main case 15 so that it can slide backward and forward at the bottom 11 of the outer case 10, the sliding friction between the outer case 10 and the main case 15 is reduced and the main case 15 can be inserted into and removed from the outer case 10 even more smoothly.

Moreover, since the connector mechanisms 30 and 39 for electrically connecting the printer 1 to the computer 5 are provided, a reliable electrical connection between the printer 1 and the computer 5 can be established.

Furthermore, since the connector mechanisms 30 and 39 are made so that they are connected when the main case 15 is inserted into the outer case 10 and disconnected when the main case 15 is pulled out of the outer case 10, the connecting and disconnecting of the electrical wiring electrically connecting the printer 1 to the computer 5 when inserting the main case 15 into or removing it from the outer case 10 can be omitted.

Further, since the before-mentioned image forming unit is located in the front portion of the main case 15, and since the media stacker 20 accommodating a plurality of stacked MC sheets 2 is provided in the rear portion of the main case 15, the recording media does not have to be transported in a U-turn or forward and backward; and since the sheet transport path 28 of the MC sheet 2 is provided in a straight line and the MC sheet 2 is transported in one direction, the structure of the transport mechanism 25, etc., can be simplified and the manufacturing costs can be significantly reduced. Moreover, since there is no need to provide a sheet feeder tray at the outside of the main case, no sheet feeder tray protrudes beyond the front of the storage bay.

Next, partial modifications of the before-mentioned embodiments will be explained.

Figure 15:
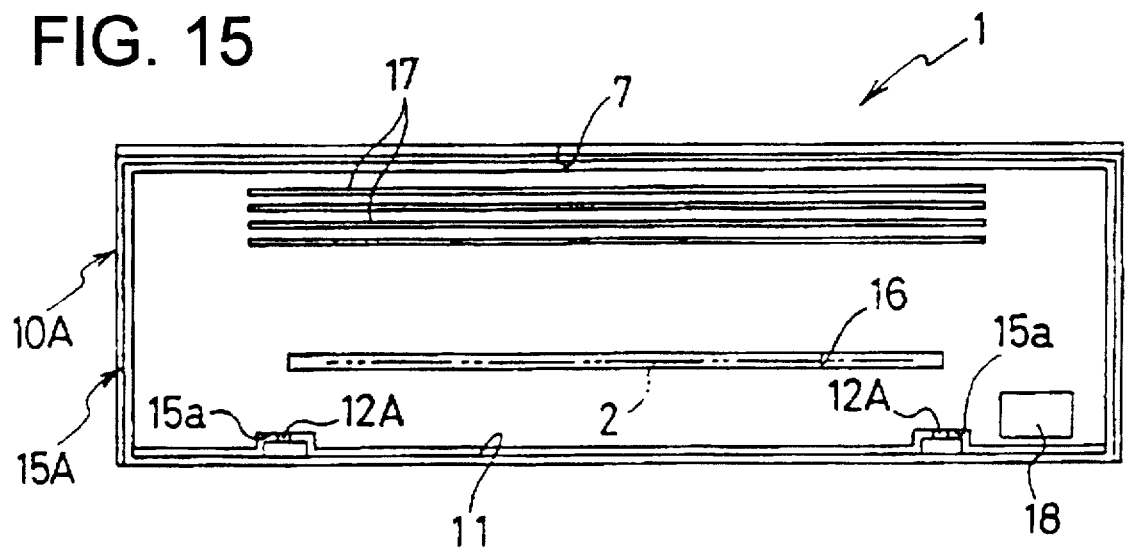
FIG. 15 is a front view showing a modified embodiment of the present invention.

1) As shown in FIG. 15, an embodiment is also possible in which one pair of a left and a right rail 12A is fixedly provided at the bottom 11 of the outer case 10A extending toward the rear and the front thereof, while, corresponding to the before-mentioned one pair of rails 12A, one pair of a left and a right rail guide 15a is formed, as a convex portion, at the underside of the bottom of the main case 15A, extending toward the rear and the front, wherein the main case 15A is supported by the one pair of rails 12A via the one pair of rail guides 15a so that it can move back and forth.

Figure 16:
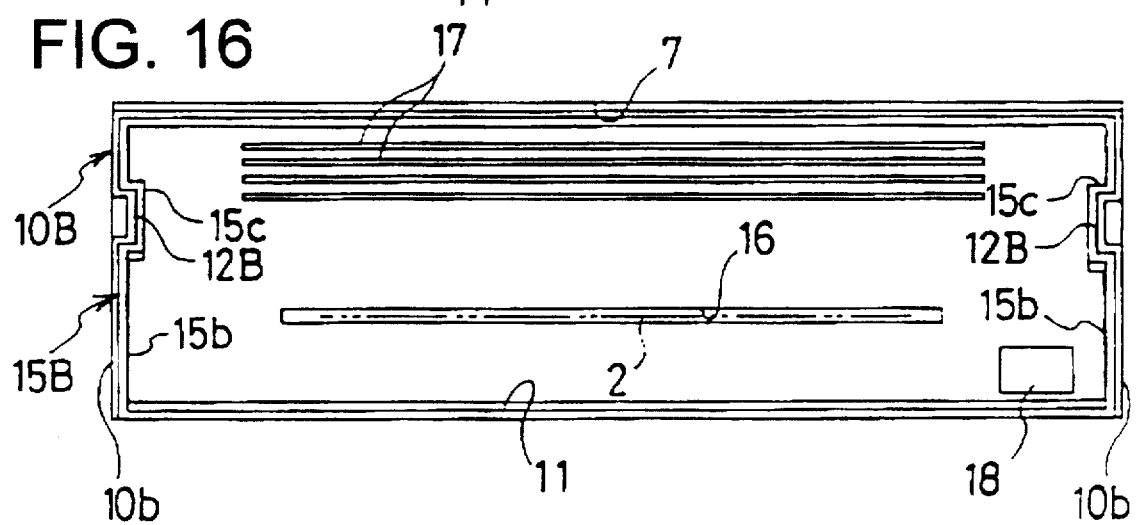
FIG. 16 is a front view showing another modified embodiment of the present invention.

2) As shown in FIG. 16, an embodiment is also possible in which one pair of slides 12B, extending toward the rear and the front, is formed by bending the upper portion of one pair of side plates 10b of the outer case 10B inward, while, corresponding to the before-mentioned one pair of slides 12B, one pair of guides 15c, extending toward the rear and the front, is formed by bending the upper portion of the side plates 15b of the main case 15B inward, wherein the main case 15B is supported by the one pair of slides 12B via the one pair of guides 15c so that it can move back and forth.

Figure 17:
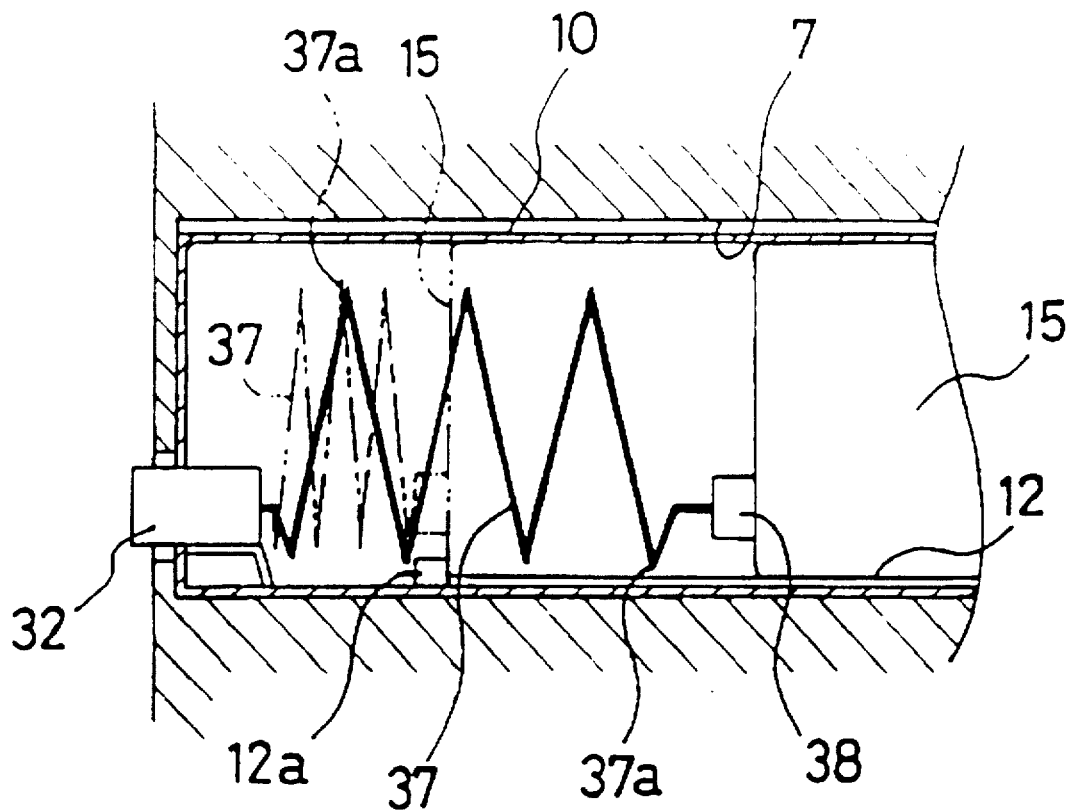
FIG. 17 is a partial side view in cross section showing yet another modified embodiment of the present invention.

3) As shown in FIG. 17, an embodiment is also possible in which a parallel port 32 fixed in the outer case 10 and a port 38 fixed at the main case 15 are connected by a flat cable 37 folded behind the main case 15 while inside the outer case 10, so as to electrically connect the printer 1 to the computer 5.

The flat cable 37 comprises a plurality of folds 37a and can be folded like an accordion; when the main case 15 is inserted into the outer case 10, as shown by the chain line, the flat cable 37 is in a substantially folded state, and when the main case 15 is pulled out of the outer case 10, as shown by the full line, the flat cable 37 gradually extends. I.e., it is possible to pull the main case 15 out of the outer case 10 and to push it back thereinto, while maintaining an electrical connection between the parallel port 32 and the port 38. Furthermore, a stopper 12a is mounted to the rear end of the slides 12, preventing the main case 15 from moving back beyond the position indicated by the chain line and assuring a space for accommodating the flat cable 37 between the outer case 10 and the main case 15.

4) The before-mentioned MC sheet 2 used as photosensitive recording medium is not limited to what has been described before, but different variations thereof are possible. Apart from the self-coloring type MC sheet 2 described above, a transfer type sheet can also be adopted. With this method, a transparent support sheet for supporting the microcapsules is integrated with an image receiving paper by superposing the face of the support sheet comprising the microcapsules with the face of the image receiving paper comprising the color developing material so that it can be peeled off; and feeding the support sheet from a cartridge to the exposure bed, it is exposed and developed in the integrated state, and then, after being discharged from the device, the image receiving paper is peeled off. The dye precursor that flows out of the microcapsules ruptured by pressure is transferred to, and reacts with the color developing material of the image receiving paper, whereupon coloring occurs and an image is produced.

Further, instead of the dye precursor, it is also possible to encapsulate the photosensitive material together with coloring materials and pigments that have been colored beforehand. In that case, a transfer type image forming method becomes possible, wherein the support sheet is integrated with image receiving paper without color developing material (i.e., normal paper) so that it can be peeled off. And when peeling off the image receiving paper, an image is produced thereon.

Moreover, apart from microcapsule sheets, photosensitive recording media such as silver salt film, diazo type photosensitive paper, etc., which form a color image when undergoing exposure by irradiation and development, can also be used.

5) There is no need to use red, green and blue light emitting elements; depending on the characteristics of the photosensitive recording medium, light emitting elements with various wavelengths can be selected. E.g., light emitting elements emitting infrared light, red, and green, or light emitting elements emitting far infrared light, near infrared light, and red can also be selected. Ultraviolet and far ultraviolet are also advantageous examples of valid color choices for light emitting elements. Moreover, the number of colors of the light emitting elements is not limited to the three colors red, green, and blue; it is equally possible to use only one or two colors, or to select four colors, as in a typical color printer using yellow, magenta, cyan, and black, or even more colors. Furthermore, the choice of light emitting elements is not limited to LEDs; other light emitting elements such as electroluminescent lamps (EL), light emitting plasma and laser devices, etc., can also be used.

Figure 18:
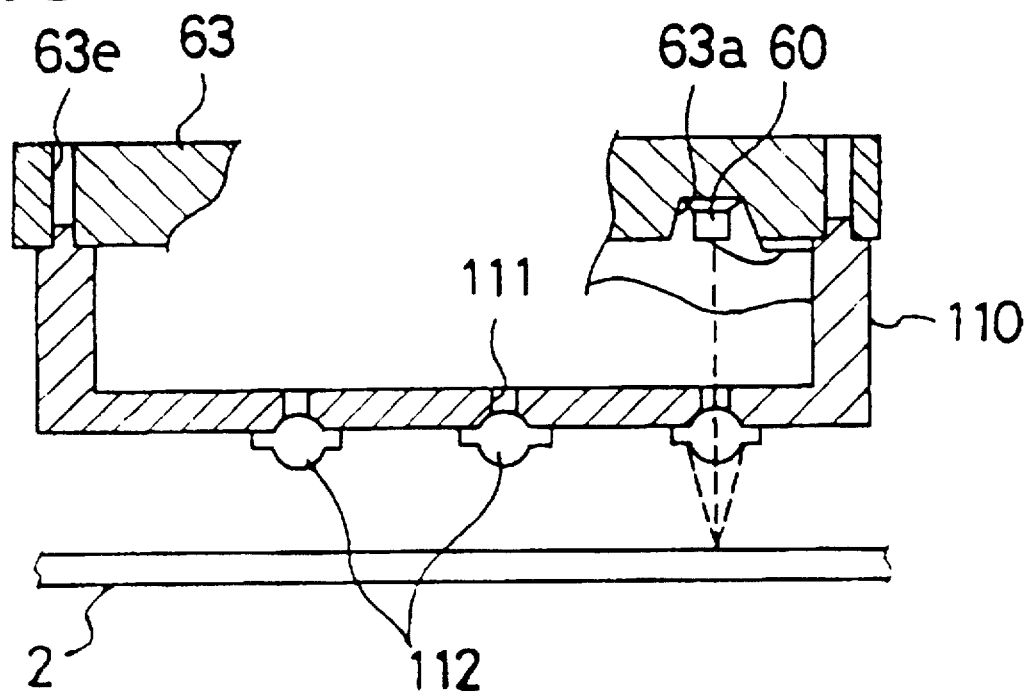
FIG. 18 is a side view showing a modified embodiment of the exposure bed in cross section.

6) As shown in FIG. 18, it is possible to use an optical imaging system of a single plastic lens, etc. The light passing aperture 111 is formed in the support member 110 inserted into the positioning holes 63e of the substrate 63 so as to face the concave portion 63a of the substrate 63, the single plastic lens 112 is mounted on the lens mount formed at the periphery of the light passing apertures 111, and the MC sheet 2 is provided at the focus position of the lens 112. In this way, when using a lens system together with the effect of the concave portion 63a, the light energy supplied to the MC sheet 2 is increased and the light utilization efficiency is improved because the incident light energy at the lens 112 is amplified.

What is claimed is:

1. An image forming device for insertion into a predetermined storage bay of an electronic equipment comprising:

an image forming unit forming an image on a recording medium;

an outer case disposed in said storage bay; and a main case accommodating said image forming unit and being inserted into the outer case so as to be removable, said recording medium being disposed in said main case.

2. The image forming device according to claim 1, further comprising:

a connector electrically connecting said image forming unit to the electronic equipment.

3. The image forming device according to claim 2, wherein said connector connects said image forming unit to the electronic equipment when the main case is inserted into the outer case and disconnects said image forming unit from the electronic equipment when the main case is pulled out of the outer case.

4. The image forming device according to claim 1, further comprising a media stacker accommodating a plurality of recording media, wherein said image forming unit is located in the front portion of the main case, and said media stacker is provided in the rear portion of the main case.

5. The image forming device according to claim 1, wherein the outer case includes a slide that supports the main case slidably in backward and forward directions in said outer case.

6. The image forming device according to claim 1, wherein said image forming unit is electrically connected to the electronic equipment via a cable folded at a space between a rear end of the main case and an outer case wall opposite to the rear end of the main case.

7. The image forming device according to claim 1, wherein the recording medium comprises a plurality of microcapsules encapsulating a coloring agent, that undergo a change of strength when irradiated with light of a predetermined wavelength, wherein said image forming unit comprises an exposure unit forming a latent image upon exposure based on image information on the recording medium by changing strength of microcapsules, and developing unit developing the latent image with the coloring agent coming out of the microcapsules by breaking the microcapsules based on the latent image.

* * * * *